United States Patent [19]

Bezard et al.

[11] 4,371,834
[45] Feb. 1, 1983

[54] DEVICE FOR MEASURING THE FREQUENCY OF AN ELECTRICAL CURRENT REPRESENTATIVE OF A VARIABLE QUANTITY

[75] Inventors: Jean-Jacques Bezard, La Garenne Colombes; Bernard A. Delevallee, Argenteuil, both of France

[73] Assignee: Jaeger, Levallois-Perret, France

[21] Appl. No.: 264,396

[22] Filed: May 18, 1981

[30] Foreign Application Priority Data

May 14, 1980 [FR] France ............................. 80 10911

[51] Int. Cl.³ .......................... G01P 3/48; G01P 3/54
[52] U.S. Cl. ...................................... 324/167; 73/520; 318/160; 324/164; 324/165
[58] Field of Search ................... 324/167, 164, 165; 73/520; 318/160

[56] References Cited

U.S. PATENT DOCUMENTS

| | | |
|---|---|---|
| 3,299,353 | 1/1967 | Grant et al. |
| 3,335,366 | 8/1967 | Byles .................................... 324/167 |
| 3,946,311 | 3/1976 | Baker et al. ........................... 324/167 |
| 3,995,499 | 12/1976 | Horii .................................. 73/520 X |
| 4,186,609 | 2/1980 | Baermann ........................... 73/520 X |

FOREIGN PATENT DOCUMENTS

| | | |
|---|---|---|
| 922445 | 1/1955 | Fed. Rep. of Germany . |
| 2117031 | of 1972 | Fed. Rep. of Germany . |
| 2115287 | 7/1972 | France . |
| 2147783 | 3/1973 | France . |
| 2227677 | 11/1974 | France . |
| 2423786 | 4/1979 | France . |
| 973996 | 11/1964 | United Kingdom ................ 324/167 |

*Primary Examiner*—Stanley T. Krawczewicz
*Attorney, Agent, or Firm*—Schwartz, Jeffery, Schwaab, Mack, Blumenthal & Koch

[57] ABSTRACT

A device to make a measurement of a variable quantity such as the speed of rotation of a first shaft or the speed of operation of an ignition system of an engine, wherein electrical pulses are produced at a frequency which is a function of the speed. The device comprises fixed first and second coils having axes in a common plane, and the planes of the coils are disposed at right-angles. Square waves corresponding to the pulses energize the first and second coils alternately, and each successive energizing of each coil is in an alternate direction, thus the magnetic field produced by the coils rotates continuously and rotates a disc magnet within the coils about an axis in the planes of the coils at an angular velocity which is a function of the speed. A rotor of conducting material in the form of a cylindrical cap over and about the magnet is integral with a second shaft coaxial with the magnet. Eddy currents induced in the rotor by the rotating magnet result in the rotor rotating in the magnetic field of the coils to rotate the shaft against arresting spring force proportional to the driving torque of the rotor which is a function of the angular velocity of the magnet. Thus a pointer on the second shaft registers a value on a dial corresponding to the speed of the first shaft or ignition system.

8 Claims, 9 Drawing Figures

DEVICE FOR MEASURING THE FREQUENCY OF AN ELECTRICAL CURRENT REPRESENTATIVE OF A VARIABLE QUANTITY

BACKGROUND OF THE INVENTION

1. Field of the Invention

The device which is the object of the present invention relates to apparatus of the type comprising a "rotating magnet", intended for measuring a variable quantity for example representative of the speed of rotation of a rotating shaft or of the ignition of the cylinders of an engine.

2. Discussion of Related Art

A measuring apparatus of this type currently used in particular for measuring the speed and distance travelled by a motor vehicle in fact comprises a magnet whereof the rotation depends on the variable to be measured and which cooperates with a rotor of conducting material and which is free to pivot and in which eddy currents occur, which are produced by the rotation of the magnet. The magnet and the rotor form what will be referred to hereafter in the description as the "movable arrangement". These currents which are themselves subject to the action of the field, determine a driving torque proportional to the speed of rotation of the magnet. This type of apparatus has numerous advantages: robustness, linearity of the graduation, direct drive of the adder for the movement of the magnet, after suitable gearing-down. The difficult point of the arrangement is the transmission of the movement representing the information to the magnet. The most conventional solution is a transmission using a flexible shaft connecting the rotating shaft of which one wishes to measure the speed, to the axis of the magnet of the movable measuring arrangement. This method has drawbacks, in particular difficulties regarding installation and maintenance. In addition, it does not allow the direct use of signals coming from the ignition device. There has thus been a tendency to replace the mechanical transmission using a flexible shaft by an electrical transmission, which on the one hand uses an emitter device which provides a signal of frequency proportional to the amplitude of the variable to be measured and on the other hand, for example, a motor whereof the average speed of rotation is proportional to the frequency of the current which supplies it, which motor sets the magnet in rotation, the latter in turn bringing about the pivoting of the rotor of the measuring apparatus. However, the use of a motor for driving the movable measuring arrangement still has several drawbacks: motors of the synchronized asynchronous type start solely when the voltage supplied by the transmitter is sufficient, i.e. from a minimal speed. Conversely, stepping motors which have a high torque at very low speed experience a reduction of the torque when the speed increases on account of the increase in its impedance.

SUMMARY OF THE INVENTION

The present invention proposes new means for driving the movable measuring arrangement and in particular a magnet of radial orientation, with the assistance of a magnetic field of rotary nature, depending on the variable to be measured and acting on the magnet/rotor system of the movable arrangement. To do this, the device according to the invention comprises a winding composed of n fixed coils (in which n is at least equal to 2) forming a predetermined angle therebetween and defining an internal space in which the movable arrangement is disposed. Said coils being connected to a circuit for receiving and distributing pulses coming from the device emitting the frequency to be measured, acting according to a method of distribution capable of creating in the vicinity of the magnet a magnetic field of rotary nature and the orientation of which is perpendicular to the axis of rotation of the magnet and of constant value.

BRIEF DESCRIPTION OF THE DRAWINGS

The invention will be described in more detail hereafter with the assistance of the accompanying drawings given as non-limiting examples and in which.

DESCRIPTION OF THE PREFERRED EMBODIMENT

Figure 1:
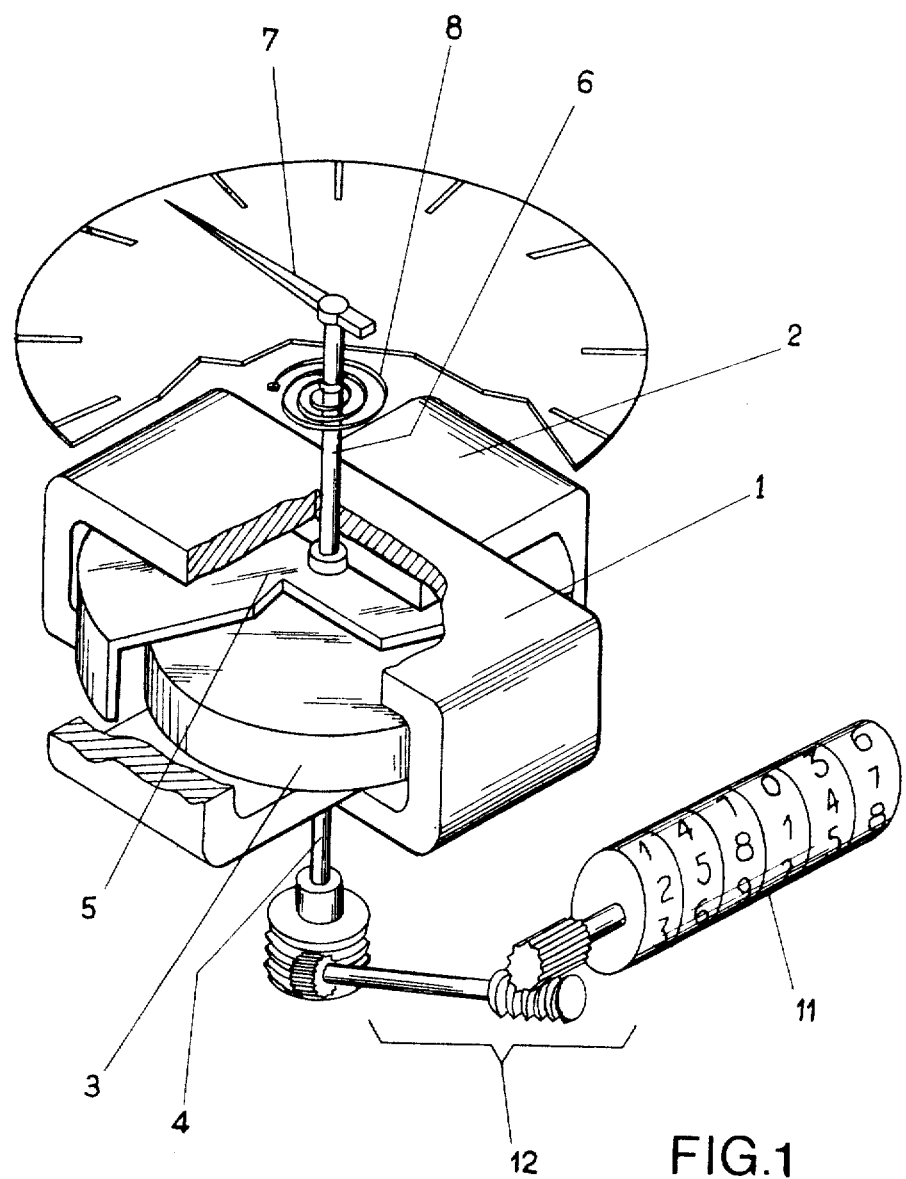
FIG. 1 shows a measuring indicator according to the invention.
Figure 2:
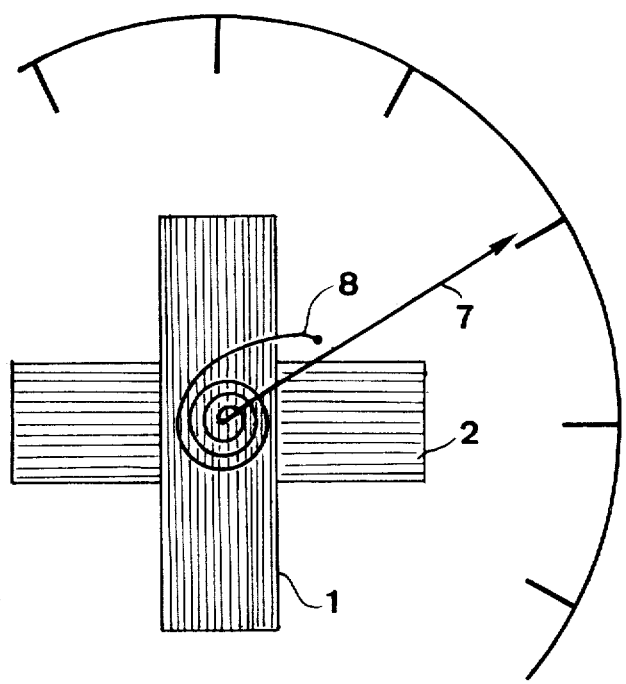
FIG. 2 is a plan view of the indicator.
Figure 3:
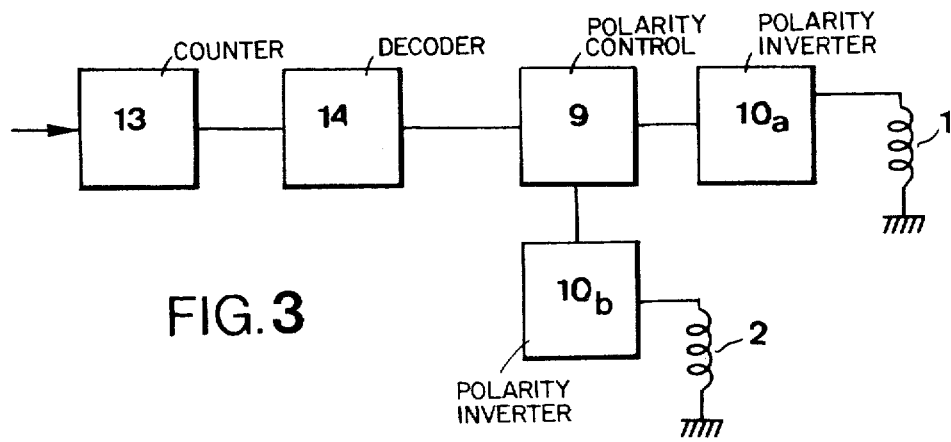
FIG. 3 is a wiring diagram of a device for supplying the coils.
Figure 5:
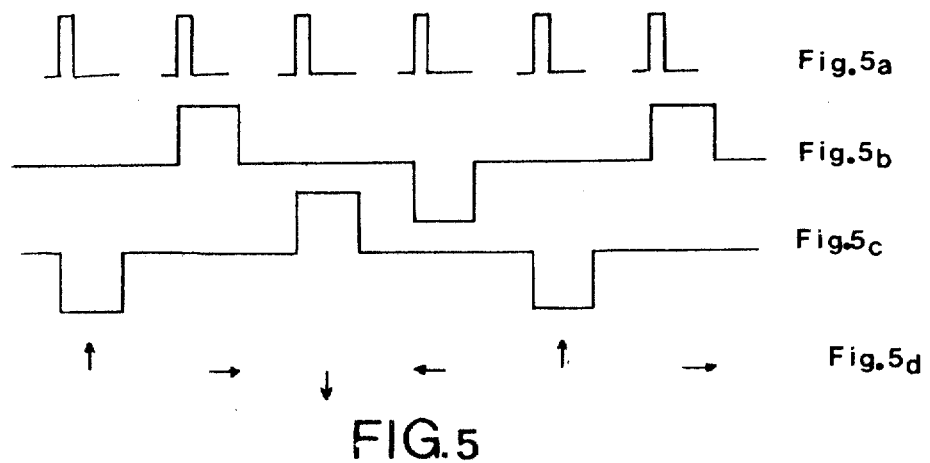
FIG. 5 is a diagram of the voltage/magnetic field created by a device according to FIG. 3 and by a supply device according to FIG. 7.

In the example illustrated in FIGS. 1 and 2, the device comprises two fixed coils 1 and 2 arranged at an angle of 90° with respect to each other, a magnet 3 integral with a spindle 4 arranged at right angles to this spindle and mounted to rotate, cooperating with which is a rotor 5 in the shape of a cup and which is made from conducting material. The rotor 5 is integral with a spindle 6 which supports the indicator needle 7 and the spiral return spring 8, which is mounted in order to exert a torque opposing the rotation of the motor 5. The rotor 5 is thus free to pivot with regard to the magnet 3. The coils 1 and 2 are supplied by a pulse pick-up (not shown) connected, for example, to the gearbox or ignition of a motor vehicle and which supplies a signal whereof the frequency is proportional to the amplitude of the variable to be measured, for example to a speed (that of the vehicle, that of the engine . . . ). According to one embodiment illustrated in FIG. 3, the pulses supplied by the pickup are sent to a counter 13 followed by a binary/decimal decoder 14, the outputs of which are connected to the inputs of a device 9 for controlling pulses, which device 9 has two polarity inverters 10a and 10b respectively supplying the coils 1 and 2 in succession with voltages of opposed polarity. According to the method of distribution illustrated in FIG. 5 and which is obtained by means of the electronic circuit whereof the diagram is given in FIG. 7, each pulse coming from the decoder 14 (pulse illustrated at 5a) is fed to the control device 9 which supplies square wave signals alternately to each coil in one given polarity then in the other polarity, according to FIG. 5b, which shows the square wave signals applied to the coil 1 and according to diagram 5c, which shows the square wave signals applied to the coil 2. Each pulse received by a coil produces in the vicinity of the magnet a transverse field with respect to the axis of rotation of the magnet, the direction of which varies in steps in order to be perpendicular to the preceding direction. (As is illustrated in FIG. 5d which represents diagrammatically the direction of the field produced by the coils). The magnet is thus swept radially by a magnetic field of rotating nature and constant value. It is thus subject to a driving torque whereof the average value, in a given time, is proportional to the number of pulses received from the pick-up and to the number of square wave signals applied to the windings. The rotation of the magnet thus gives rise to eddy currents in the rotor 5, which currents, since they are themselves subject to the action of the field, determine a driving torque proportional to the speed of rotation of the magnet and thus of the member to which the pulse pick-up is connected. The rotor 5 pivots through an angle such that the return torque of the spiral spring 8 is equal to the driving torque, the needle 7 thus indicates the speed of rotation of the magnet.

The spindle 4, integral with the magnet (FIG. 1) also drives an adder 11 for adding the distance covered, by means of reduction gearing 12 having a suitable ratio.

The device described uses two coils mounted at right angles one with respect to the other, but this arrangment is not limiting. It is possible to use three coils arranged at an angle of 60° with respect to each other and so on. The objective is always to achieve a rotation of the movable arrangement by a constant angle, for a constant frequency of the pulses.

Another possibility for obtaining a driving torque is to distribute the pulses to the two coils, no longer alternately, but according to the following sequential order, in which U is the peak voltage of the pulses:

TABLE 1

| | Sequences | | | | | | | |
|---|---|---|---|---|---|---|---|---|
| Coil 1 | O | U | U | U | O | −U | −U | −U |
| Coil 2 | −U | −U | O | U | U | U | O | −U |

Figure 6:
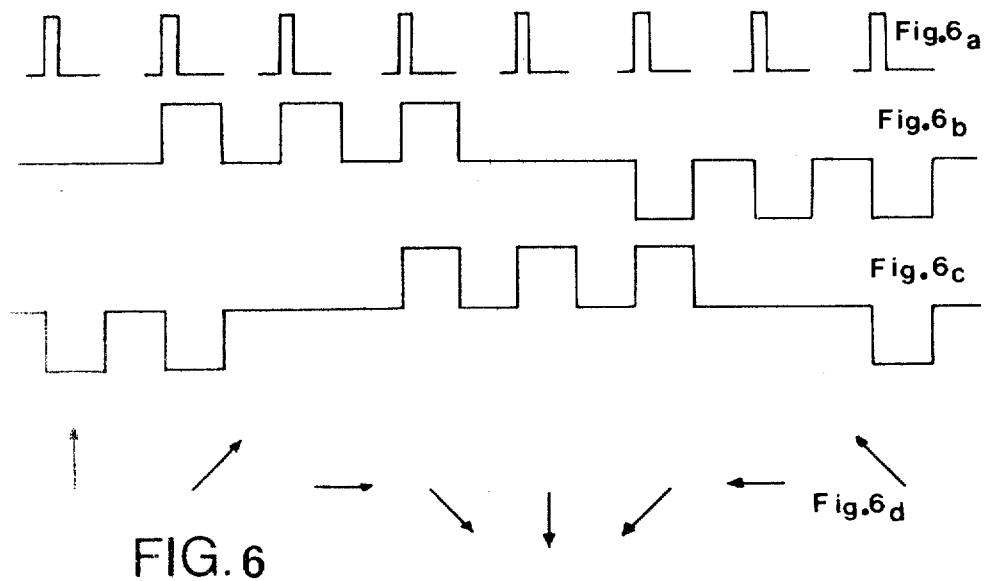
FIG. 6 is a diagram of the voltage/magnetic field created by a variation of the supply device according to FIG. 8.

The diagram of the pulses according to this method is given in FIG. 6, in which FIG. 6a represents a sequence of pulses coming from the decoder 14, FIG. 6b shows the characteristic of the voltage at the terminals of the coil 1 and FIG. 6c shows the characteristic of the voltage at the terminals of the coil 2. It can be seen from FIG. 6d, which represents diagrammatically the direction of the field produced by the coils, that when the two coils are supplied at the same time, the magnet is subject to a resultant magnetic field which is successively staggered by 45° with respect to its preceding position.

If one wishes to avoid the necessity of the inverter device, it is possible to use coils each comprising two windings wound in opposite directions, the supply of each of these windings consequently creating two fields of opposed direction. In this case, the control device 9 supplies the four windings 1a, 1b, 2a and 2b alternately and sequentially (as is apparent from FIG. 4 which is a wiring diagram of a device for supplying the coils) in the following manner:

TABLE 2

| | | Sequences | | | |
|---|---|---|---|---|---|
| Coil 1 | Winding 1a | O | U | O | O |
| | Winding 1b | O | O | O | U |
| Coil 2 | Winding 2a | O | O | U | O |
| | Winding 2b | U | O | O | O |

The electronic devices making it possible to obtain the above mentioned distributions of pulses will now be described hereafter by way of example. As illustrated, these devices supply two coils arranged at an angle of 90° with respect to each other, however the present invention may be easily adapted to embodiments comprising more than two coils, such as for example three coils arranged at an angle of 60° with respect to each other.

Figure 7:
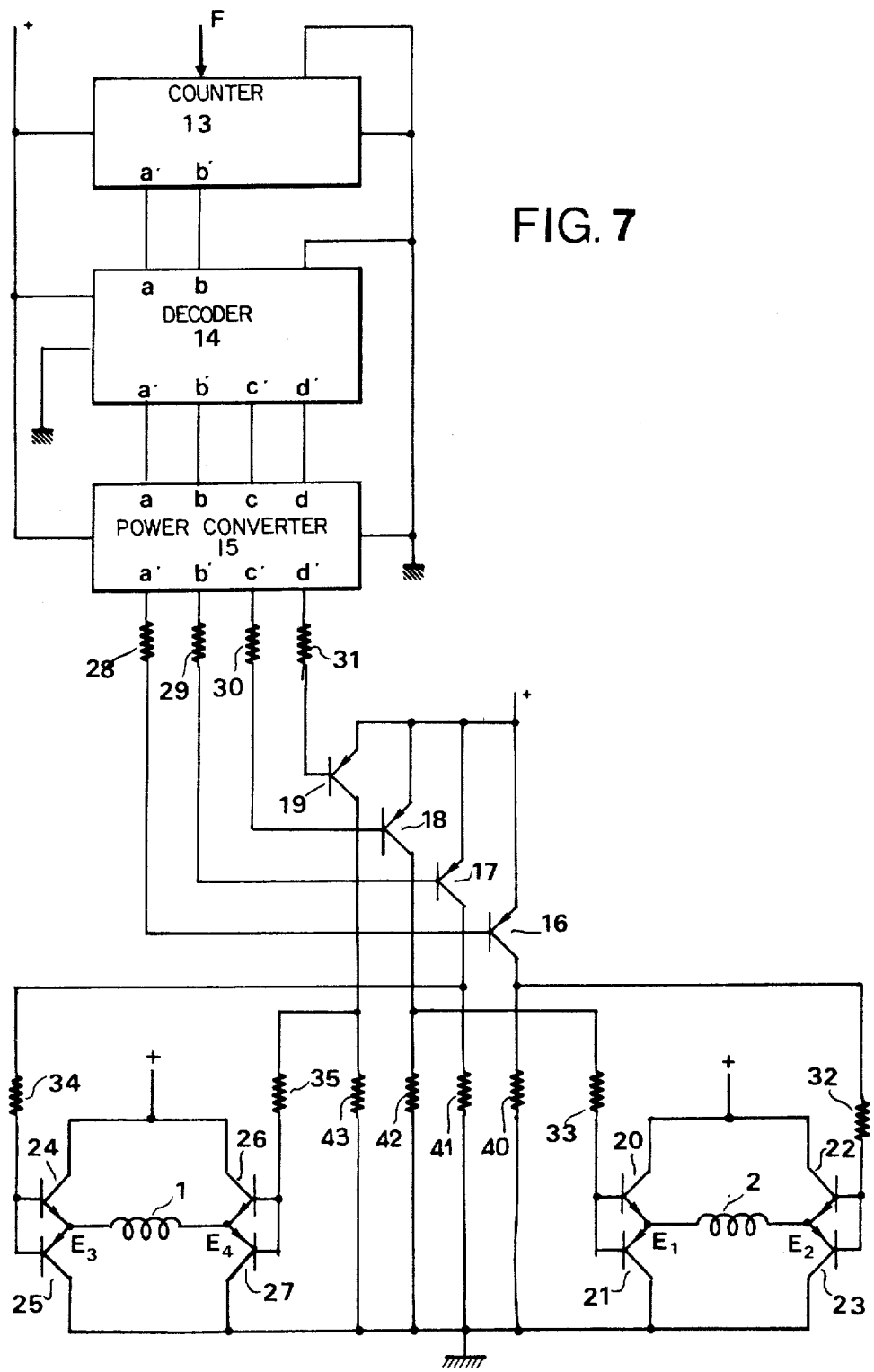
FIG. 7 is an electronic diagram of one embodiment of the device according to FIG. 3.

FIG. 7 illustrates a control device making it possible to obtain the distribution of pulses of alternately opposed polarity, such as illustrated in FIG. 5. The signal coming from the pick-up and of which one wishes to measure the frequency, is applied to a pulse counter 13, the two outputs 13a' and 13b' of which are respectively connected to the inputs 14a and 14b of a decoder 14 converting the binary code of the pulses received from the counter 13, into a decimal code and supplying said pulses at four of its outputs 14a', 14b', 14c' and 14d' to a power converter 15. The levels of the pulses appearing at the outputs of the decoder 14 correspond to the combinations of the level of the pulses applied to the inputs of the latter in the following manner:

TABLE 3

| Inputs of the decoder 14 | | Outputs of the decoder 14 | | | |
|---|---|---|---|---|---|
| a | b | a' | b' | c' | d' |
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

It will be seen from this table that each output of the decoder 14 is supplied in turn and the same is consequently true for each input of the converter 15. The coil 2 is connected between the common points $E_1$ of the emitters of an NPN transistor 20 and a PNP transistor 21 and $E_2$ of the emitters of an NPN transistor 22 and a PNP transistor 23. In a symmetrical manner, the coil 1 is connected between the common points $E_3$ of the emitters of an NPN transistor 24 and a PNP transistor 25 and $E_4$ of an NPN transistor 26 and a PNP transistor 27. The output 15a' of the converter 15 is connected by means of a resistor 28 to the base of a transistor 16, whereof the emitter receives the supply voltage of the device and the collector is connected to the base of the transistors 22 and 23 by means of a resistor 32. When a pulse appears at the output 15a', the transistor 16 becomes conducting and the coil 2 is supplied in the direction $E_2$–$E_1$ across the transistors 22 and 21.

According to table 3, the second pulse of level 1 appears at the output 15b' of the converter, it is thus the base of the transistor 17 which is supplied through the intermediary of the resistor 29. Said transistor thus becomes conducting, its collector being connected by means of the resistor 34 to the base of the transistors 24 and 25, the winding 1 is in turn supplied in the direction $E_3$–$E_4$ across the transistors 24 and 27. In the same way, the appearance of the third pulse of level 1 at the output 15c' will render the transistor 18, conducting, by means of the resistor 30 connecting the base of the latter to the output 15c'. Since the collector of the latter is connected across the resistor 33 to the base of the transistors 20 and 21, the winding 2 is supplied in the direction $E_1-E_2$, across the transistors 20 and 23. The fourth pulse then causes the conduction of the transistor 19, whereof the base is connected by means of the resistor 31 to the output 15d' and the supply of the coil 1 in the direction $E_4-E_3$, across the transistors 26 and 25, the collector of the transistor 19 being connected by means of the resistor 35 to the base of the transistors 26 and 27.

Furthermore, the emitters of the PNP transistors 16,17,18,19 are jointly connected to a positive terminal of the supply and their collectors are respectively connected to the earth of the supply by means of resistors 40,41,42,43; whereas the collectors of the NPN transistors 20,22,24,26 are connected to the positive terminal of the supply and the collectors of the PNP transistors 21,23,25,27 are connected to the earth of the supply.

Naturally, this diagram is given by way of example and any other device could be provided for reproducing the supply sequences of the two windings without diverging from the scope of the present invention.

Figure 8:
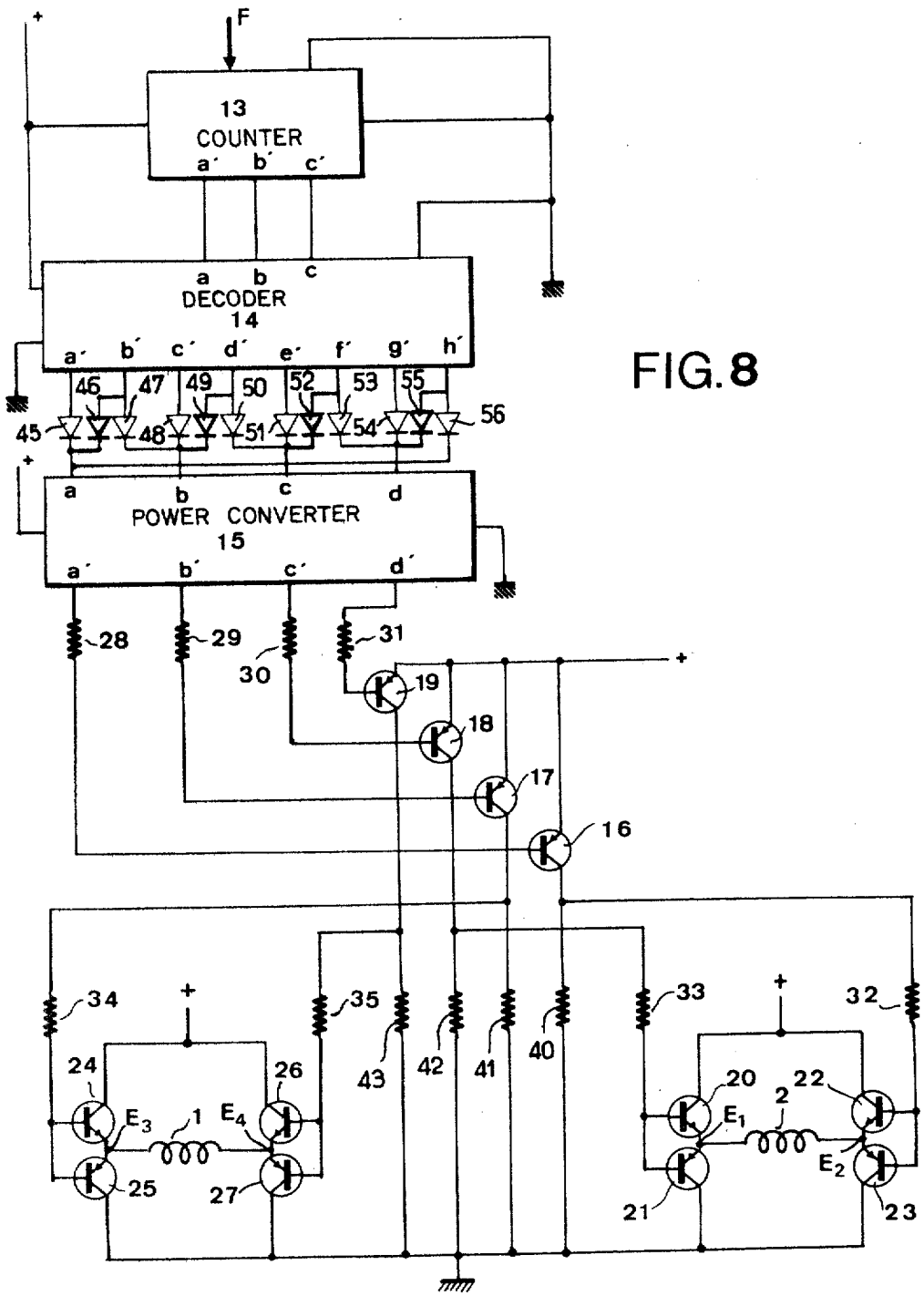
FIG. 8 shows a variation of the same device.

FIG. 8 shows a method of supplying the windings making it possible to obtain a distribution of the pulses according to table 1. To do this, three outputs of the counter 13 are connected to three inputs of the decoder 14, of which one uses eight outputs selected one after the other in order to allow a pulse of level 1 to appear at each output of the decoder 14, from the binary code supplied by the counter 13, in the following manner:

TABLE 4

| Inputs of the decoder 14 | | | Outputs of the decoder 14 | | | | | | | |
|---|---|---|---|---|---|---|---|---|---|---|
| a | b | c | a' | b' | c' | d' | e' | f' | g' | h' |
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

Each of the even outputs 14a',14c',14e',14g' of the decoder 14 is connected to one input 15a,15b,15c,15d of the converter 15 and to one alone, by means of diodes 45,48,51,54, whereof the anode is connected to the outputs 14a',14c',14e' and 14g' and the cathode is connected to the inputs 15a,15b,15c and 15d, whereas each odd output 14b',15d',14f',14h' is connected by means of diodes 46,47,49,50,52,53,55,56 to the cathodes of the diodes 45,48,51,54 located at the immediately preceding and following even outputs. The anodes of the diodes 46,47,49,50,52,53,55, and 56 are connected to the corresponding outputs 14b',14d',14f' and 14h' and the cathodes of the same diodes are connected to the corresponding cathodes of the diodes 45,48,51,54. The output 14h' is fed back to the input 15a in order to obtain the following distribution:

TABLE 5

| Outputs of the decoder 14 | | | | | | | | Inputs of the converter 15 | | | |
|---|---|---|---|---|---|---|---|---|---|---|---|
| a' | b' | c' | d' | e' | f' | g' | h' | a | b | c | d |
| 1 | 0 | 0 | 0 | 0 | 0 | 0 | 0 | 1 | 0 | 0 | 0 |
| 0 | 1 | 0 | 0 | 0 | 0 | 0 | 0 | 1 | 1 | 0 | 0 |
| 0 | 0 | 1 | 0 | 0 | 0 | 0 | 0 | 0 | 1 | 0 | 0 |
| 0 | 0 | 0 | 1 | 0 | 0 | 0 | 0 | 0 | 1 | 1 | 0 |
| 0 | 0 | 0 | 0 | 1 | 0 | 0 | 0 | 0 | 0 | 1 | 0 |

TABLE 5-continued

| Outputs of the decoder 14 | | | | | | | | Inputs of the converter 15 | | | |
|---|---|---|---|---|---|---|---|---|---|---|---|
| a' | b' | c' | d' | e' | f' | g' | h' | a | b | c | d |
| 0 | 0 | 0 | 0 | 0 | 1 | 0 | 0 | 0 | 0 | 1 | 1 |
| 0 | 0 | 0 | 0 | 0 | 0 | 1 | 0 | 0 | 0 | 0 | 1 |
| 0 | 0 | 0 | 0 | 0 | 0 | 0 | 1 | 1 | 0 | 0 | 1 |

The same sequences are to be found at the output of the power converter 15 and thus by means of the resistors 28,29,30,31 on the base of the PNP transistors 16,17,18 and 19 which control the supply of the windings 1 and 2 according to the method provided in table 1 and illustrated in FIG. 6. As for the remainder the device for supplying the windings is absolutely in accordance with that of FIG. 7.

Figure 4:
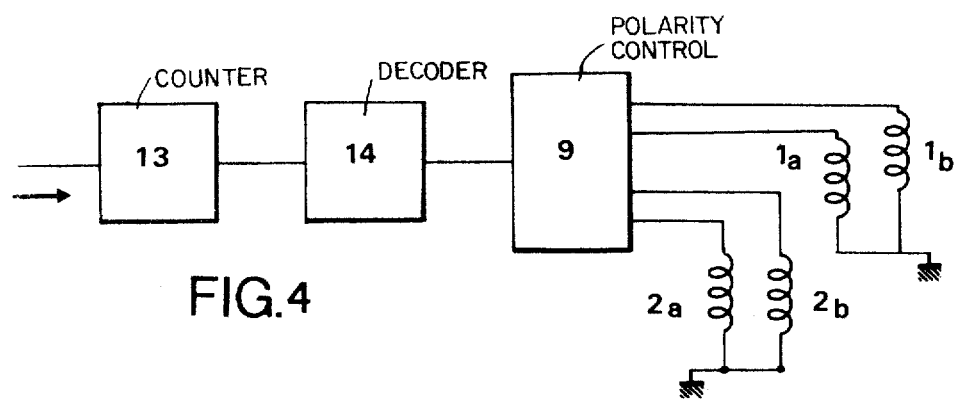
FIG. 4 is a wiring diagram of a second device for supplying the coils.
Figure 9:
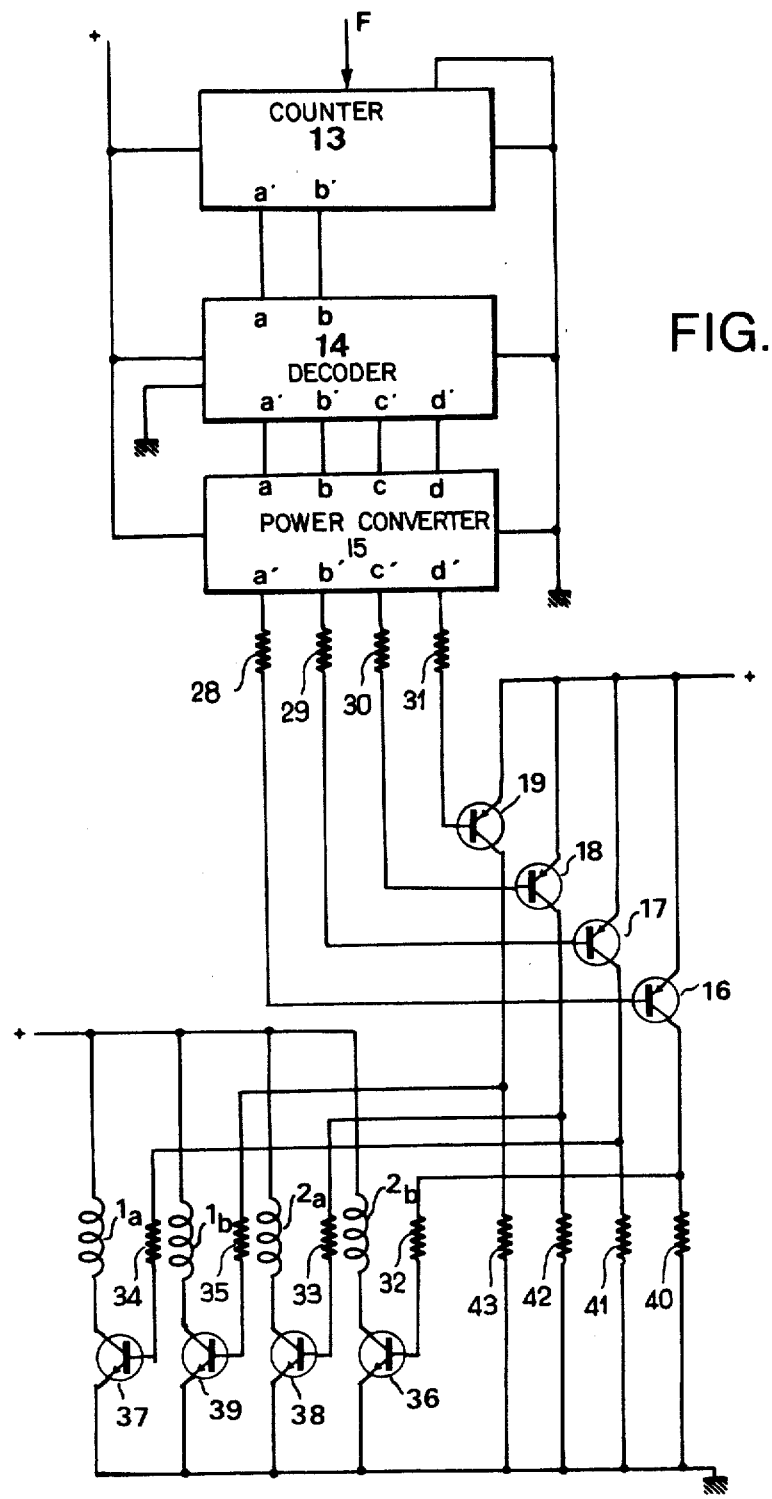
FIG. 9 is an electronic diagram of the device according to FIG. 4.

FIG. 9 illustrates an embodiment of the supply to the coils, according to the wiring diagram of FIG. 4 and to table 2, in which each coil comprises two windings a and b, wound in opposite directions. The distribution of pulses at the output of the power converter 15 is identical to the distribution of pulses at the output of the decoder 14 and is thus illustrated in table 3. The NPN transistor 36, whereof the base is connected by means of the resistor 32 to the collector of the PNP transistor 16 is firstly rendered conducting and supplies the winding 2b connected between its collector and the positive supply terminal. Similarly, the NPN transistors 37,38,39, whereof the bases are connected by means of resistors 34,33,35 to the collectors of the PNP transistors 17,18,19, successively supply the windings 1a,2a and 1b connected between their respective collectors and the positive terminal of the supply. The emitters of the transistors 36,37,38,39 are jointly connected to the earth of the supply. The bases of said transistors 16,17,18,19 are connected to the outputs 15a',15b',15c' and 15d' by means of the resistors 28,29,30,31, whereas their emitters are jointly connected to the positive terminal of the supply and their collectors are connected by means of the resistors 40,41,41,43 to the earth of the supply.

A simultaneous alternate distribution such as that of tables 4 and 5 can also be provided, without difficulty, in this case by using for example a connection between the decoder 14 and the converter 15 identical to that of FIG. 8.

Apart from the above-mentioned advantages, the device described provides the advantage of being unaffected by voltage variations. In fact, the speed of rotation of the moving magnet which causes adding depends solely on the frequency of the signal supplied, whereas the speed of rotation of the cup-shaped member which drives the speedindicator depends solely on the induction of the magnet. The latter is regulated in place, by progressive demagnetization.

What is claimed is:

1. A device responsive to a variable quantity, comprising:
   means sensitive to said variable quantity for producing and transmitting a signal composed of pulses having a frequency proportional to said variable quantity;
   a permanent magnet integral with a first spindle, said first spindle having an axis of rotation, said magnet being arranged transversely with respect to said axis of the first spindle and mounted to rotate freely about the axis of said first spindle;

a cup-shaped rotor of conducting material disposed in the vicinity of and covering said permanent magnet, said rotor being integral with a second spindle, said second spindle having an axis which is aligned with the axis of the first spindle, said rotor being mounted to pivot about the axis of said second spindle;

a return spring acting upon said second spindle and mounted to exert a torque opposing the rotation of the rotor;

an indicator needle supported by said second spindle transversely to its axis for indicating the position of the rotor;

at least two coils offset angularly to each other and surrounding said permanent magnet and said cup-shaped rotor; and a receiver device which receives said pulses and supplies said two coils with square wave signals produced from said pulses in order to produce a transverse magnetic field with respect to the axis of the first spindle, said transverse magnetic field having a rotary nature about said axis of the first spindle, so as to produce a rotation of said permanent magnet at a speed proportional to said variable quantity, whereby the cup-shaped rotor is subjected to a driving torque due to the production of eddy currents generated when the permanent magnet rotates and to an opposing torque due to the return spring, the cup-shaped rotor being immobilized in a predetermined position representative of said variable quantity when the opposing torque equals said driving torque.

2. The device according to claim 1, wherein the receiver device comprises n polarity-inverting devices, n being equal to the number of coils connected to supply the same winding with square wave signals of opposed polarity.

3. The device according to claim 2, wherein each polarity-inverting device is formed by two pairs of bipolar transistors, each pair of transistors comprising NPN and PNP transistors, the collector of the NPN transistor of the first pair being connected to the collector of the NPN transistor of the second pair and the collector of the PNP transistor of the first pair being connected to the collector of the PNP transistor of the second pair, the bases and emitters of the NPN and PNP transistors of the first pair being respectively connected, the bases and emitters of the NPN and PNP transistors of the second pair being respectively connected, and the coils being connected between the common emitters of each pair, while said square wave signals are applied between the common bases of each pair of transistors.

4. The device according to claim 2, wherein the receiver device comprises means for controlling the polarity-inverting devices such that each of the polarity-inverting devices supplies a square wave which changes polarity every n pulses and the square waves emitted by the various polarity-inverting devices are out of phase with respect to each other by 180°/n, in reference to a complete cycle of 360°.

5. The device according to claim 2, wherein the receiver device comprises means for controlling the polarity-inverting devices such that each of the polarity-inverting devices supplies a square wave of given polarity during three successive pulses, the polarity of said square waves being inverted, every $2^n$ pulses and the square waves emitted by the various polarity-inverting devices are out of phase with respect to each other by 180°/n, in reference to a complete cycle of 360°.

6. A device according to claim 1, wherein each coil is comprised of two windings wound in opposite directions.

7. A device according to claim 6, wherein the receiver device comprises means for distributing the pulses such that the two windings of the same coil are supplied successively by square waves corresponding to one pulse having respectively opposed polarity, the square waves supplying the various coils being out of phase with respect to each other by 180°n, in reference to a complete cycle of 360°.

8. A device according to claim 6, wherein the receiver device comprises means for distributing the pulses such that the two windings of the same coil are supplied successively by square waves corresponding to three pulses having respectively opposed polarity, the square waves supplying the different coils being out of phase with respect to each other by 180°n, in reference to a complete cycle of 360°.

* * * * *